United States Patent [19]
Anagnostou et al.

[11] 4,083,097
[45] Apr. 11, 1978

[54] METHOD OF MAKING ENCAPSULATED SOLAR CELL MODULES

[75] Inventors: Evelyn Anagnostou, Westlake; Americo F. Forestieri, Berea, both of Ohio

[73] Assignee: The United States of America as represented by the Administrator of the National Aeronautics and Space Administration, Washington, D.C.

[21] Appl. No.: 746,269

[22] Filed: Nov. 30, 1976

[51] Int. Cl.² .......................................... H01L 37/00
[52] U.S. Cl. ..................................... 29/572; 29/628; 136/89 P; 136/89 H
[58] Field of Search ............... 29/572, 628; 136/89 R, 136/89 P, 89 H, 89 PC, 89 TF

[56] References Cited
U.S. PATENT DOCUMENTS

| 2,919,298 | 12/1959 | Regnier et al. | 136/89 PC |
| 2,962,539 | 11/1960 | Daniel | 136/89 TF |
| 3,255,047 | 6/1966 | Escoffery | 29/572 X |
| 3,268,366 | 8/1966 | Guyot | 136/89 PC |
| 3,780,424 | 12/1973 | Forestieri et al. | 29/572 |

OTHER PUBLICATIONS

IBM Tech. Disclosure Bulletin, vol. 4, No. 11, Apr. 1962, p. 62, Crawford et al., "Pluggable Solar Cell".

Primary Examiner—Carl E. Hall
Attorney, Agent, or Firm—N. T. Musial; J. R. Manning; G. E. Shook

[57] ABSTRACT

Electrical connections to solar cells in a module are made at the same time the cells are encapsulated for protection. The encapsulating material is embossed to facilitate the positioning of the cells during assembly.

6 Claims, 4 Drawing Figures

METHOD OF MAKING ENCAPSULATED SOLAR CELL MODULES

STATEMENT OF GOVERNMENT OWNERSHIP

The invention described herein was made by employees of the United States Government and may be manufactured or used by or for the Government without the payment of any royalties thereon or therefor.

BACKGROUND OF THE INVENTION

This invention is directed to an improved low cost solar cell module. The invention is particularly concerned with making an encapsulated solar cell module having improved electrical contacts.

The electrical contacts to solar cells in modules must be sturdy to withstand handling. These contacts are presently made individually and in a separate operation. This contacting process is tedious and time-consuming. Such a process is also costly because it requires much handling of the cells and contacts. Another disadvantage is the contact must be thicker than necessary which is wasteful of the material.

U.S. Pat. No. 2,919,298 to Regnier et al teaches the mounting of solar cells in parabolic depressions of metallic sheet which is used as a reflector. The cells are then covered with a thermoplastic sheet containing conductive strips therein to make the necessary connections.

U.S. Pat. No. 3,025,330 to Ralph shows a plurality of solar cells embedded in a non-conductive panel. The cells are connected together by two flexible metal films separated by a flexible insulating layer. The electrical connections and the encapsulation are not accomplished in a single step.

U.S. Pat. No. 3,268,366 to Guyot teaches the mounting of cells in a grid which enables connections to be made by any known means including printed circuitry. After the connections are made, a window is mounted over each cell. The finished array has three surfaces including a front window, grid and back metal surface.

U.S. Pat. No. 2,962,539 to Daniels discloses the mounting of solar cells in depressions on a flexible sheet which serves as a mounting platform. Printed circuitry may be used for the connections.

OBJECTS OF THE INVENTION

It is, therefore, an object of the present invention to provide an encapsulated solar cell module that has improved electrical contacts.

Another object of the invention is to provide an improved process for making an encapsulated solar cell module which is less costly and make electrical contact during encapsulation.

Still another object of the invention is to provide an improved solar cell module in which solar cells of various configurations can be used with only slight modification.

A further object of the invention is to provide an improved solar cell module in which the embossing depth may be modified so that a variety of cells of various thicknesses can be handled or used.

An additional object of the invention is to provide an improved process for encapsulating cells into modules with less handling so that the process is suitable for automation.

These and other objects of the invention will be apparent from the specification which follows and from the drawing wherein like numerals are used throughout to identify like parts.

SUMMARY OF THE INVENTION

The problems of the prior art have been solved by utilizing the method of the present invention in which solar cells are encapsulated in a plastic material. The encapsulating material is embossed to enable the cells to be readily positioned for final encapsulation. The electrical connections to the solar cells are made at the same time the cells are encapsulated.

DESCRIPTION OF THE PREFERRED EMBODIMENT

Figure 1:
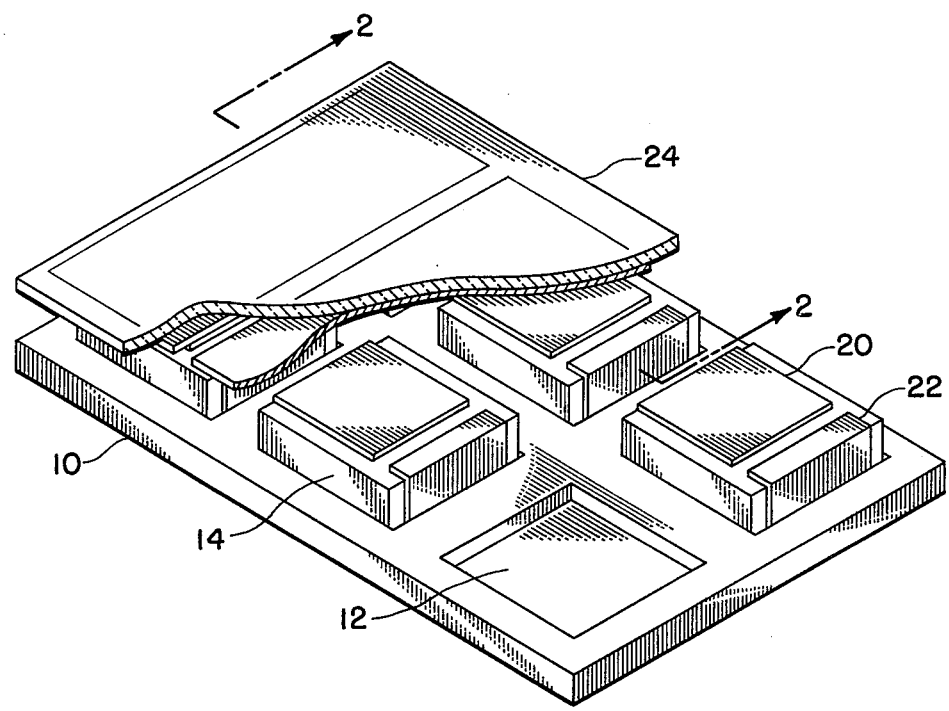
FIG. 1 is a perspective view with parts broken away of a solar cell module constructed in accordance with the invention.

Referring now to the drawing there is shown in FIG. 1 a sheet 10 of transparent plastic material which is utilized as a cover. A fluorinated ethylene propylene copolymer film described in U.S. Pat. No. 2,946,763 has been suitable for this purpose. This film is known commercially as Teflon FEP, and it is an interpolymer of tetrafluoroetylene and hexafluoropropylene. It is further contemplated that other clear film may be used.

According to the present invention, a flat sheet of this fluorinated ethylene propylene copolymer is heated and pressure molded to form an embossed surface having a plurality of depressions 12 arranged in rows. Each depression 12 has the same configuration as a solar cell, and each cover sheet 10 has as many depressions in an array of adjacent rows as are required for the particular application.

The depth of each depression is sufficient to position the solar cell. The depth of the depression will depend on the material used in the cover sheet 10. More particularly, the amount of material flow during lamination or fabrication is a determining factor in designing the depth of the depressions 12.

Figures 2, 4:
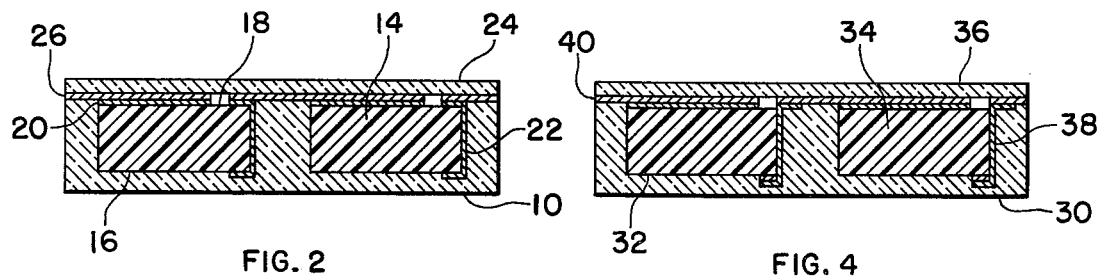
FIG. 2 is a vertical section view taken along the line 2—2 in FIG. 1.
FIG. 4 is a vertical section view similar to FIG. 2 showing an alternate embodiment of the invention.

Referring to FIGS. 1 and 2, a plurality of solar cells 14 are placed in the depressions 12. Each depression contains one solar cell having its first surface 16 in contact with the sheet 10. Thus, the front surface 16 of the solar cell 14 which is to face the light source contacts the bottom of the depression 12.

Solar cells 14 with positive and negative contacts on the back surface 18 are preferred. These contacts 20 and 22 are shown in FIGS. 1 and 2. N on P cells are preferred for space applications. With this type of cell the contact 20 is positive and the contact 22 is negative. With P on N cells the contacts 20 and 22 are negative and positive respectively.

Figure 3:
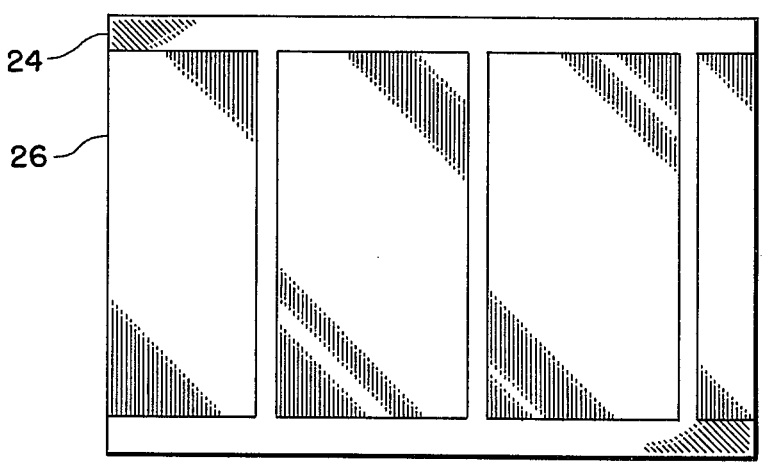
FIG. 3 is a plan view of a back plastic sheet hving printed circuitry thereon.

A second sheet of fluorinated ethylene propylene copolymer 24 shown best in FIG. 3 has the required interconnecting circuitry metalization 26 on it. The sheet 16 is likewise an interpolymer of tetrafluoroethylene and hexafluoroethylene, as described in U.S. Pat. No. 2,946,763. It is also contemplated that other materials may be used.

Metal films 26 forming the circuitry can be much thinner than contacts now in use. By way of example, the conventional contacts presently used are about 1 to 2 mils thick. In contrast, the printed circuit contacts of the present invention are less than about ½ mil. These films are so positioned on the sheet 24 that each electrically connects the contacts 20 on all the cells 14 in one row to the contacts 22 on the cells in an adjacent row.

The plastic sheet 24 is placed over the solar cells 14 in the depressions 12 in a sheet 10 as shown in FIG. 1. The assembly is then laminated to insure a good FEP bond. During this step the electrical connections are made by thermal compression bonding.

DESCRIPTION OF AN ALTERNATE EMBODIMENT

Referring now to FIG. 4 there is shown an embodiment utilizing solar cells 34 having conventional front-back contacts. A cover sheet 30 of Teflon FEP or the like is embossed to form depression 32 in the same manner as used to form the depressions 12 in the cover sheet 10.

In the embodiment of FIG. 4 the interconnecting circuitry metalization is on both the cover sheet 30 as well as a backing sheet 36. A metal contact 38 is formed on each depression 32 in the cover sheet 30 before the solar cell 34 is placed therein. A metal film 40 on the backing sheet 36 connects the contacts 38 in each row with the back surface of the solar cells in adjacent rows. The electrical connections are made by sintering upon assembly.

While a preferred example of the invention has been shown and described it will be appreciated that various modifications may be made to the invention without departing from the spirit of the invention or the scope of the subjoined claims. By way of example, the electrical connections may be made using printed circuits in both the cells and the back cover.

What is claimed is:

1. A method of making a module of solar cells having a transparent cover comprising the steps of
    forming a plurality of depressions in said transparent cover,
    placing a solar cell in each of said depressions so that the front surfaces of the solar cells which are to face a light source contact the bottoms of said depressions,
    positioning a back cover over said solar cells in contact with the back surfaces thereof opposite said front surfaces, and
    electrically connecting said solar cells while securing said transparent cover to said back cover.

2. A method of making a module of solar cells as claimed in claim 1 wherein the transparent cover is embossed to form a plurality of depressions in an array of rows.

3. A method of making a module of solar cells as claimed in claim 2 wherein each solar cell has both positive and negative electrical contacts on said back surface thereof opposite said front surface including the steps of
    forming a plurality of metal films on said back cover prior to positioning the same over said solar cells, and
    positioning said back cover over said solar cells so that said metal films electrically connect the contacts on all the cells in one row to the contacts on the cells in an adjacent row.

4. A method of making a module of solar cells as claimed in claim 3 including the steps of
    laminating said transparent cover to said back cover while simultaneously forming electrical connections between adjacent solar cells by compression bonding.

5. A method of making a module of solar cells wherein each solar cell has one contact on the front surface thereof and another contact on the back surface thereof comprising the steps of
    forming a plurality of depressions in a transparent cover,
    forming a first metal film in each depression,
    placing a solar cell in each of said depressions so that the front surface of the solar cell which is to receive light faces the bottom of said depression and contacts said first metal film,
    forming a plurality of second metal films on said back cover, and
    positioning said back cover over said solar cells so that said second metal films electrically connect the first metal films on all the depressions in one row to the back surface contacts on all the cells in an adjacent row.

6. A method of making a module of solar cells as claimed in claim 5 including the steps of
    laminating said transparent cover to said back cover while simultaneously forming electrical connections between adjacent solar cells by sintering.

* * * * *